US012744511B2

(12) United States Patent
Slotte

(10) Patent No.: US 12,744,511 B2
(45) Date of Patent: Sep. 22, 2026

(54) RESONATOR WITH PLURALITY OF AIR PASSAGES

(71) Applicant: AAC Technologies Pte. Ltd., Singapore (SG)

(72) Inventor: Benedict Slotte, Tampere (FI)

(73) Assignee: AAC Technologies Pte. Ltd., Singapore (SG)

( * ) Notice: Subject to any disclaimer, the term of this patent is extended or adjusted under 35 U.S.C. 154(b) by 1049 days.

(21) Appl. No.: 17/941,037

(22) Filed: Sep. 9, 2022

(65) Prior Publication Data

US 2024/0088868 A1 Mar. 14, 2024

(51) Int. Cl.
*H03H 9/15* (2006.01)
*G10K 11/04* (2006.01)

(52) U.S. Cl.
CPC ............... *H03H 9/15* (2013.01); *G10K 11/04* (2013.01)

(58) Field of Classification Search
CPC ................................ H03H 9/15; G10K 11/04
See application file for complete search history.

(56) References Cited

U.S. PATENT DOCUMENTS 3,573,400 A * 4/1971 Sessler ..................... H04R 1/38 381/357
8,381,872 B2 * 2/2013 Alexander ........... G10K 11/162 52/145
8,705,774 B2 * 4/2014 Jilani ..................... H04R 17/02 381/431
2007/0081027 A1 * 4/2007 Beltran ...................... B41J 2/14 347/46
2013/0299055 A1 * 11/2013 Gobinath ............. B60C 23/135 152/450

* cited by examiner

*Primary Examiner* — Emily P Pham
(74) *Attorney, Agent, or Firm* — Wlersch Law Group

(57) ABSTRACT

Provided is a resonator. The resonator includes: at least one air cavity and a plurality of air passages communicating with the air cavity. The air cavity and the plurality of air passages are tuned to generate one or more acoustic resonances. Therefore, the desired low acoustic damping can be reasonably well maintained, while distributing higher modes over a wider set of frequencies, while also making each of them proportionally weaker. Thus, they may be more easily made weak enough not to interfere with the desired behaviour of the overall acoustic resonator construction.

16 Claims, 12 Drawing Sheets

Prior art

Prior art

Prior art

RESONATOR WITH PLURALITY OF AIR PASSAGES

TECHNICAL FIELD

The present invention relates to the field of resonator technology, and in particular, to a resonator.

BACKGROUND

An acoustic resonator refers to a structure that generates an acoustic resonant frequency, and it is usually a Helmholtz resonator. A Helmholtz resonator typically comprises a cavity and a tube connecting with the cavity. An axis of the tube may be longer compared to an acoustic wavelength. As a result, the resonator may have additional resonances due to higher modes at higher frequencies.

In the related art, in a case, proper attenuation is desired for any resonances that are higher in frequency than the main (lowest) resonant frequency of the resonator, in which case sound attenuation material is usually applied in an air passage or air volume of the resonator, and the low acoustic damping required at the main resonant frequency of the resonator cannot be guaranteed.

In the related art, in another case, the resonator has a short air passage compared to an acoustic wavelength in order to avoid higher modes in the air passage, and as a result the air passage also requires a small cross-sectional area to maintain its acoustic mass. As a result, an air flow rate in the resonator air passage is increased, in which case the low acoustic damping required by the resonator cannot be reasonably maintained, and so the desired behaviour of the resonator cannot be guaranteed either.

SUMMARY

In view of this, the embodiments of the present invention provide a resonator aiming to guarantee the desired behaviour of the resonator.

In an aspect, an embodiment of the present invention provides a resonator, including: at least one air cavity and a plurality of air passages communicating with the air cavity. The air cavity and the plurality of air passages are tuned to generate one or more acoustic resonances.

Further, the resonator further includes: an acoustic port provided at the at least one air cavity.

Further, each of the plurality of air passages is a tube.

Further, a cross-sectional shape of each tube is a circle, a rectangle or an irregular figure.

Further, the axis of each tube is bent toward a same side.

Further, each of two ends of each tube includes a rounded corner structure or a horn-shaped structure.

Further, the plurality of air passages is a plurality of partitions of a single tube; and a respective dividing wall is provided between any two adjacent partitions of the plurality of partitions.

Further, each of the plurality of air passages includes a groove.

Further, the plurality of air passages are parallel to each other.

Further, the plurality of air passages are arranged along a first direction; and along the first direction, a respective effective length of each of the plurality of air passages gradually decreases.

Further, for all the effective lengths of the plurality of air passages, a ratio of the largest effective length to the smallest effective length is smaller than 2.

Further, an effective length of each of the plurality of air passages is calculated by a formula: $L_n=k_nL_0$, where $L_0$ denotes a length of a corresponding single air passage for achieving a desired acoustic mass, $k_n$ denotes a coefficient of $L_0$, $L_n$, denotes the effective length of the air passage, and n denotes a sequential number of the air passage.

Further, an effective length of each of the plurality of air passages is calculated by a formula:

$$L_n = \left(k_n \frac{1}{N} \sum_{m=1}^{N} \frac{1}{k_m}\right) L_0,$$

where $L_0$ denotes the length of a corresponding single air passage for achieving a required acoustic mass, $k_n$ denotes a coefficient of $L_0$, N denotes a total number of air passages, $L_n$ denotes the effective length of the air passage, and n denotes a sequential number of the air passage.

Further, an effective cross-sectional area of each of the plurality of air passages is calculated by a formula:

$$A_n = k_n \frac{A_0}{N},$$

where $A_0$ denotes a cross-sectional area of a corresponding single air passage for achieving a desired acoustic mass, $k_n$ denotes a coefficient of $L_0$, N denotes a total number of air passages, $A_n$ denotes the effective cross-sectional area of the air passage, and n denotes a sequential number of the air passage.

Further, the coefficient $$k_n = \frac{N}{r-1}\left(r^{\frac{n}{N}} - r^{\frac{n-1}{N}}\right),$$

where N denotes a total number of air passages, and r is a constant.

Further, the air cavity includes a first surface, a second surface, and a third surface; the first surface is adjacent to the second surface, the first surface is adjacent to the third surface, and the second surface is opposite to the third surface; and a part of the plurality of air passages is provided at the first surface, another part of the plurality of air passages is provided at the second surface, and further another part of the plurality of air passages is provided at the third surface.

Further, the air passage provided at the second surface is bent toward an extension direction of the air passage provided at the first surface, and the air passage provided at the third surface is bent toward the extension direction of the air passage provided at the first surface.

Further, the plurality of air passages partially extends into the air cavity, or the plurality of air passages entirely extends into the air cavity.

Further, each of the plurality of air passages comprises an end communicating with the air cavity, and another end communicating with an external air volume which is chosen from air passage, air cavity and acoustic resonator.

In the technical solution provided by the embodiments of the present invention, the resonator includes at least one air cavity and a plurality of air passages communicating with the air cavity, and the air cavity and the air passages communicating with the air cavity are tuned, so that the desired acoustic mass and low acoustic damping of the air passages can be reasonably well maintained, while distributing higher modes over a larger set of frequencies. Thus, resonance peaks caused by the higher modes in a frequency response of the resonator can be attenuated so as not to interfere with the desired behaviour of the overall acoustic resonator construction.

BRIEF DESCRIPTION OF DRAWINGS

In order to more clearly illustrate technical solutions in embodiments of the present invention, the accompanying drawings used in the embodiments are briefly introduced as follows. It should be noted that the drawings described as follows are merely part of the embodiments of the present invention, and other drawings can also be acquired by those skilled in the art without paying creative efforts.

DESCRIPTION OF EMBODIMENTS

For better illustrating technical solutions of the present invention, embodiments of the present invention will be described in detail as follows with reference to the accompanying drawings.

It should be noted that, the described embodiments are merely exemplary embodiments of the present invention, which shall not be interpreted as providing limitations to the present invention. All other embodiments obtained by those skilled in the art without creative efforts according to the embodiments of the present invention are within the scope of the present invention.

The terms used in the embodiments of the present invention are merely for the purpose of describing particular embodiments but not intended to limit the present invention. Unless otherwise noted in the context, the singular form expressions "a", "an", "the" and "said" used in the embodiments and appended claims of the present invention are also intended to represent plural form expressions thereof.

It should be understood that the term "and/or" used herein is merely an association relationship describing associated objects, indicating that there may be three relationships, for example, A and/or B may indicate that three cases, i.e., A existing individually, A and B existing simultaneously, B existing individually. In addition, the character "/" herein generally indicates that the related objects before and after the character form an "or" relationship.

In many constructions involving the resonators in the related art, it is desired to make the air channel as an acoustic mass within the whole range of audio frequencies at which the resonators are expected to operate. However, since the wavelength of sound decreases with frequency, such an air channel no longer behaves mostly like a pure acoustic mass when higher frequencies are reached, at which the wavelength of sound is no longer small compared with an axial length (i.e., length in the sound propagation direction) of the air channel. Additional longitudinal acoustic resonances are produced roughly at frequencies where certain fractional multiples (for example, ½, 1, 3/2, . . . ) of the wavelength coincide with the length of the air channel. The exact frequencies of these higher longitudinal modes are dependent on the acoustic structures to which the air channel connects. There are multiple longitudinal modes appearing at regular or almost regular intervals above a given frequency. The effect of higher modes on a frequency response of a construction that includes the resonator is often negative and undesired.

Figure 1:
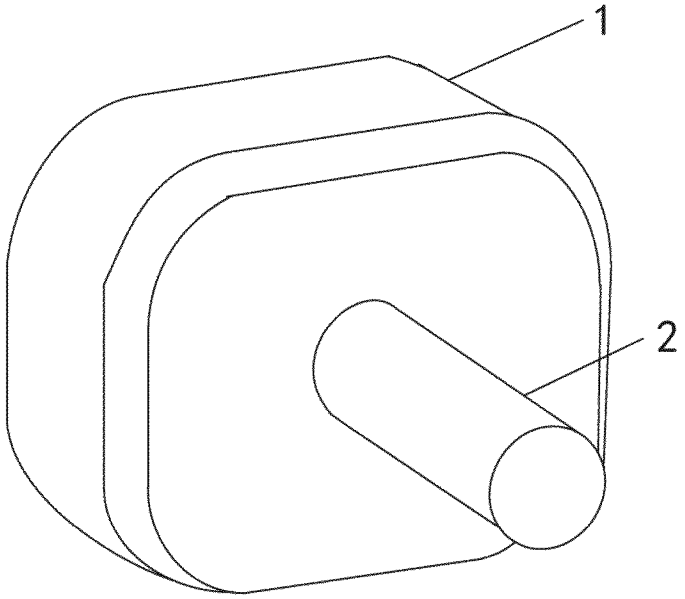
FIG. 1 is a schematic diagram of a structure of a resonator in the related art.

FIG. 1 is a schematic diagram of a structure of a resonator in the related art. As shown in FIG. 1, the resonator includes: an air cavity 1 and a tube 2 communicating with the air cavity 1. The air cavity 1 and the tube 2 are tuned to generate acoustic resonance. Generally, a tube 2 with a shorter length and a smaller cross-sectional area is adopted to communicate with the air cavity 1, therefore, the air flow rate in the resonator increases, which in turn increases the risk of certain other artifacts (especially flow noise in the tube or out of the tube, nonlinear distortion due to excessive variation of acoustic resistance with flow speed, and attenuation of the main resonance of the resonator), in which case the low acoustic damping required by the resonator cannot be reasonably maintained, so the desired behaviour of the resonator cannot be guaranteed.

Figure 2:
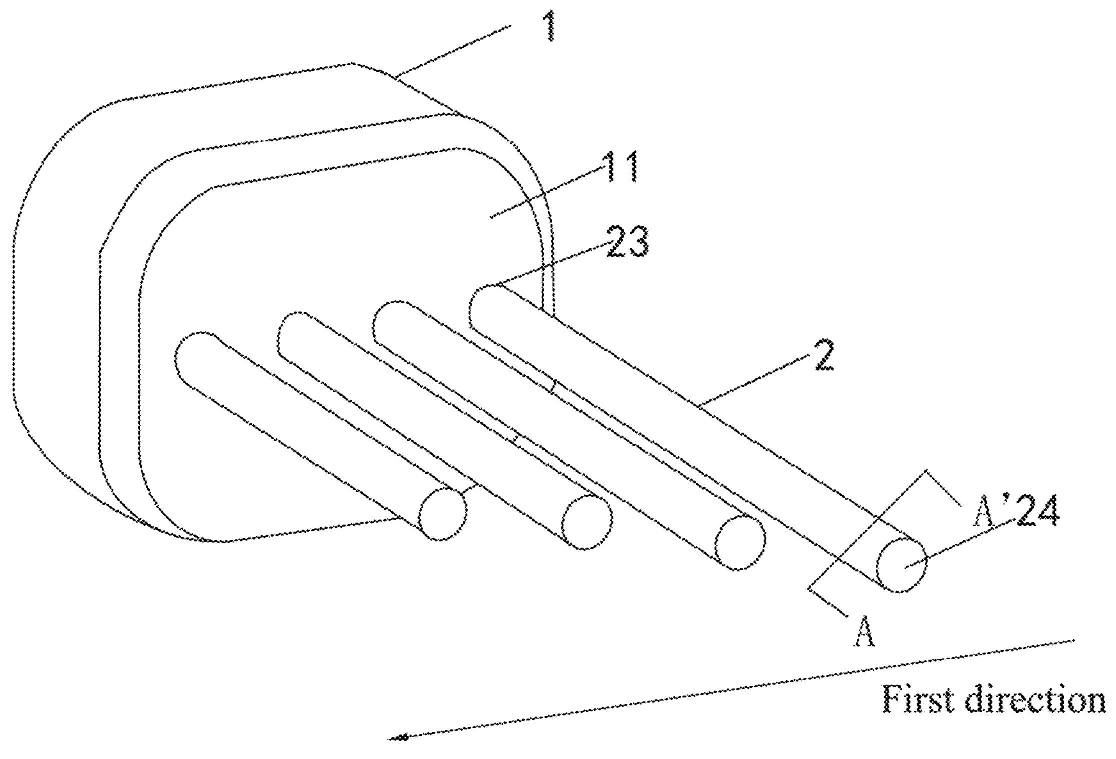
FIG. 2 is a schematic diagram of a structure of a resonator according to an embodiment of the present invention.

In order to solve the technical problems in the related art, an embodiment of the present invention provides a resonator. FIG. 2 is a schematic diagram of a structure of a resonator according to an embodiment of the present invention, as shown in FIG. 2, the resonator includes: at least one air cavity 1 and a plurality of air passages communicating with the air cavity 1, and the air cavity 1 and the air plurality of air passages are tuned to generate one or more acoustic resonances.

In this embodiment of the present invention, as shown in FIG. 2, the resonator includes only one air cavity 1. The air cavity 1 has a hollow structure. The air cavity 1 may include a plurality of side walls 11. In an example, the air cavity 1 includes a cubic structure, and the air cavity 1 may include six side walls 11, or less than six side walls 11 (such as five side walls 11). The air passage is provided at one or more side walls.

In this embodiment of the present invention, the air passage may be a tube 2. In this case, the resonator may include a plurality of tubes 2, and the plurality of tubes 2 communicates with the air cavity 1. As shown in FIG. 2, in an example, the plurality of tubes 2 are provided at a same side wall 11.

In this embodiment of the present invention, the plurality of air passages are arranged parallel to each other. As shown in FIG. 2, in a case that the air passage is a tube 2, the plurality of tubes 2 are arranged in parallel to each other. The plurality of tubes 2 may be arranged in one row and multiple columns, or be arranged in multiple rows and multiple columns. As shown in FIG. 2, the plurality of tubes 2 are arranged in one row and multiple columns. The plurality of tubes 2 are spaced apart from each other, and the respective distances between any two adjacent tubes 2 may be the same or different. As shown in FIG. 2, for example, the respective distances between any two adjacent tubes 2 are the same, that is, the plurality of tubes 2 are spaced from each other with a same distance.

In an embodiment, the plurality of tubes 2 may be arranged not parallel to each other, for example, the plurality of tubes 2 may be arranged in a divergent shape, and such a case is not shown in the figures.

More than one tube 2 may be provided. In the present invention, the number of tubes 2 can be determined according to actual requirements, for example, the number of tubes 2 may be determined according to available space, available dimension, and performance requirements of the resonator. As shown in FIG. 2, four tubes 2 are taken as an example for description, and the four tubes 2 are arranged parallel to each other with a same distance between any adjacent two of the four tubes 2.

In the embodiments of the present invention, the cross-sectional shapes of the plurality of tubes 2 may be the same or different. For example, all the tubes 2 have a same cross-sectional shape, or some of the tubes 2 have a same cross-sectional shape, or each tube 2 has a different cross-sectional shape.

Figure 3:
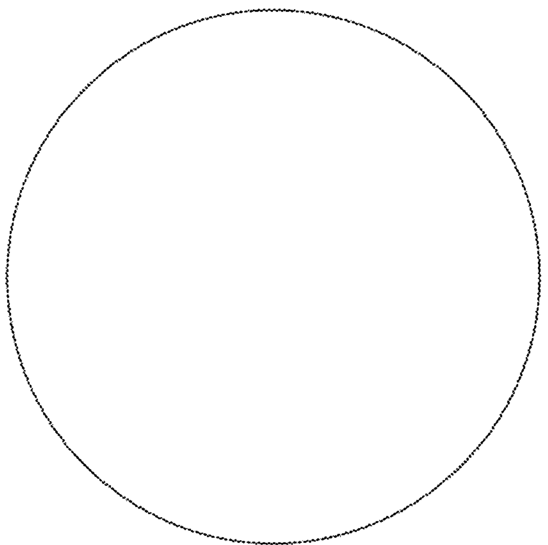
FIG. 3 is a cross-sectional view along A-A' of an air passage shown in FIG. 2.

The cross-sectional shape of the tube 2 can be determined according to actual requirements. FIG. 3 is a cross-sectional view taken along A-A' of the air passage shown in FIG. 2. As shown in FIG. 3, the cross-sectional shape of the tube 2 is circle. In other embodiments, the cross-sectional shape of the tube 2 may also be other shape, such as a rectangle, a hexagon, an ellipse, or an irregular shape.

In an embodiment of the present invention, an end 23 of the air passage communicates with the air cavity 1, and another end 24 of the air passage is open. As shown in FIG. 2, in a case that the air passage is a tube 2, an end 23 of the tube 2 communicates with the air cavity 1, and another end 24 of the tube 2 is open. Herein, the end 23 of the tube 2 refers to an end communicating with the air cavity 1, and the other end 24 of the tube 2 refers to an end away from the air cavity 1.

In an example, an end of the air passage communicates with the air cavity, and another end of the air passage communicates with another external air volume. The external air volume may be an air passage, an air cavity, or an acoustic resonator. In a case that the external air volume is an air passage and the air passage is a tube, an end of the tube communicates with an air cavity, and another end of the tube communicates with another air cavity, that is, each of two ends of the tube communicates with a respective air cavity, i.e., the tube communicates with two air cavities, and such a case is not shown in the figures.

In this embodiment of the present invention, the plurality of air passages are arranged along a first direction, and along the first direction, an effective length of each of the plurality of air passages gradually decreases. As shown in FIG. 2, in a case that the air passage is a tube 2, the plurality of tubes 2 are arranged along the first direction, and along the first direction, the effective length of each of the plurality of tubes 2 gradually decreases.

In this embodiment of the present invention, along the first direction, a ratio of the effective length of any air passage to the effective length of the next air passage is greater than 1 and smaller than or equal to 2. In an example, as shown in FIG. 2, in a case that the air passage is a tube 2, along the first direction, the ratio of the effective length of any tube 2 to the effective length of the next tube 2 may be 2. In other examples, the ratio of the effective length of any tube 2 to the effective length of the next tube 2 may be greater than 1 and smaller than 2.

In this embodiment of the present invention, for all the air passages, the ratio of the effective length of an air passage to the effective length of the next air passage has a same value; or, for some of the air passages, the ratio of the effective length of an air passage to the effective length of the next air passage has a same value; or, for all the air passages, the ratio of the effective length of an air passage to the effective length of the next air passage has a different value. In a case that the air passage is a tube, for all the tubes, the ratio of the effective length of a tube to the effective length of the next tube has a same value; or, for some of the tubes, the ratio of the effective length of a tube to the effective length of the next tube has a same value; or, for all the tubes, the ratio of the effective length of a tube to the effective length of the next tube has a different value. As shown in FIG. 2, for all the tubes 2, the ratio of the effective length of a tube 2 to the effective length of the next tube 2 has a same value.

In an embodiment of the present invention, for the respective effective lengths of the plurality of air passages, a ratio of the largest effective length to the smallest effective length is smaller than 2. As shown in FIG. 2, in a case that the air passage is a tube 2, for the respective effective lengths of the plurality of tubes, a ratio of the largest effective length to the smallest effective length is smaller than 2.

In this embodiment of the present invention, the effective length of the air passage is calculated by the formula (1): $L_n=k_nL_0$. As shown in FIG. 2, in a case that the air passage is a tube 2, $L_0$ denotes a length of a corresponding single tube 2 for achieving the desired acoustic mass, $k_n$ denotes a coefficient of $L_0$, $L_n$ denotes the effective length of the tube 2, and n denotes a sequential number of the tube 2 along the first direction.

In this embodiment of the present invention, an effective cross-sectional area of the air passage is calculated by the formula (2):

$$A_n = k_n \frac{A_0}{N}.$$

As shown in FIG. 2, in a case that the air passage is a tube 2, $A_0$ denotes a cross-sectional area of a corresponding single tube 2 for achieving the desired acoustic mass, $k_n$ denotes a coefficient of $L_0$, N denotes the total number of tubes 2, $A_n$ denotes the effective cross-sectional area of the tube 2, and n denotes a sequential number of the tube 2 along the first direction.

In this embodiment of the present invention, the coefficient $k_n$ is calculated by the formula (3):

$$k_n = \frac{N}{r-1}\left(r^{\frac{n}{N}} - r^{\frac{n-1}{N}}\right).$$

As shown in FIG. 2, in a case that the air passage is a tube 2, N denotes the total number of tubes 2, and r is a constant.

In this embodiment of the present invention, the sequential number n of the air passage along the first direction ranges from 1 to N. As shown in FIG. 2, in a case that the air passage is a tube 2, the total number of tubes 2 is four, and the respective sequential numbers of the tubes 2 along the first direction are sequentially 1, 2, 3, 4, that is, n is equal to 1, 2, 3, or 4.

In this embodiment of the present invention, a value of the constant r is larger than 1 and smaller than or equal to 2. It can sometimes help to reduce the height of resonance peaks caused by some of highest modes, at the expense of less reduction of the lower modes.

The effective length and the effective cross-sectional area of the air passage can be determined by the formula (1) to the formula (3). In an example, as shown in FIG. 2, in a case that the air passage is a tube 2, the effective length of the tube 2 and the effective cross-sectional area of the tube 2 that are calculated can be slightly enlarged to compensate for the slight increase in acoustic damping generated by using a plurality of tubes 2.

For ensuring a simpler mechanical implementation, the respective cross-sectional areas of the air passages may be the same, instead of being scaled as in formula (2). In an example, the effective length of the air passage is calculated by a formula (4):

$$L_n = \left(k_n \frac{1}{N} \sum_{m=1}^{N} \frac{1}{k_m}\right) L_0.$$

As shown in FIG. 2, in a case that the air passage is a tube 2, $L_0$ denotes the length of a corresponding single tube 2 for achieving the required acoustic mass, $k_n$ denotes the coefficient of $L_0$, N denotes the total number of tubes 2, $L_n$, denotes the effective length of the tube 2, and n denotes the sequential number of the air passage along the first direction. The total number of tubes 2 shown in FIG. 2 is four, that is, N is equal to 4.

In this embodiment of the present invention, as shown in FIG. 2, in a case that the air passage is a tube 2, the effective length of the tube 2 and the effective cross-sectional area of the tube 2 can be approximately determined by the formula (1) to the formula (4), and the effective length of the tube 2 and the effective cross-sectional area of the tube 2 can be slightly adjusted according to the cross-sectional shape of the tube 2 and other constraints.

In an embodiment of the present invention, as shown in FIG. 2, in a case that the air passage is a tube 2, the total number N of tubes 2 can be freely selected, noting that a low number will not redistribute and attenuate higher modes as efficiently as a larger number, but also that a large number will result in smaller individual areas for each tube 2, which leads to progressively higher acoustic damping, thus attenuating also the desired main resonance of the acoustic resonator.

In the technical solution provided by the embodiments of the present invention, the resonator includes at least one air cavity and a plurality of air passages communicating with the air cavity, and the air cavity and the air passages communicating with the air cavity are tuned, so that the desired acoustic mass and low acoustic damping can be reasonably well maintained, while distributing higher modes over a larger set of frequencies. Thus, resonance peaks caused by the higher modes in a frequency response of the resonator can be attenuated so as not to interfere with the desired behaviour of the overall acoustic resonator construction.

In the technical solution provided by this embodiment of the present invention, the structure of the resonator ensures the desired main resonance frequency and a reduced effect of higher modes, and the problem of nonlinear distortion caused by a shorter and narrower air passage in the related art is solved.

In the technical solution provided by this embodiment of the present invention, the air flow at one or two ends of the separated air passage will naturally be distributed along a larger distance, rather than all being distributed at a single end point. This can be advantageous when the air passage is connected to a constricted or geometrically complex air space, where it would otherwise be difficult to accommodate a large flow rate from a single air passage without causing flow noise or other artifacts.

In the technical solution provided by this embodiment of the present invention, there are no discontinuities along the length of any given air passage partition. This can avoid possible issues with flow noise that may arise if a single air passage is fitted with parallel resonators presenting edges etc.

Figure 4:
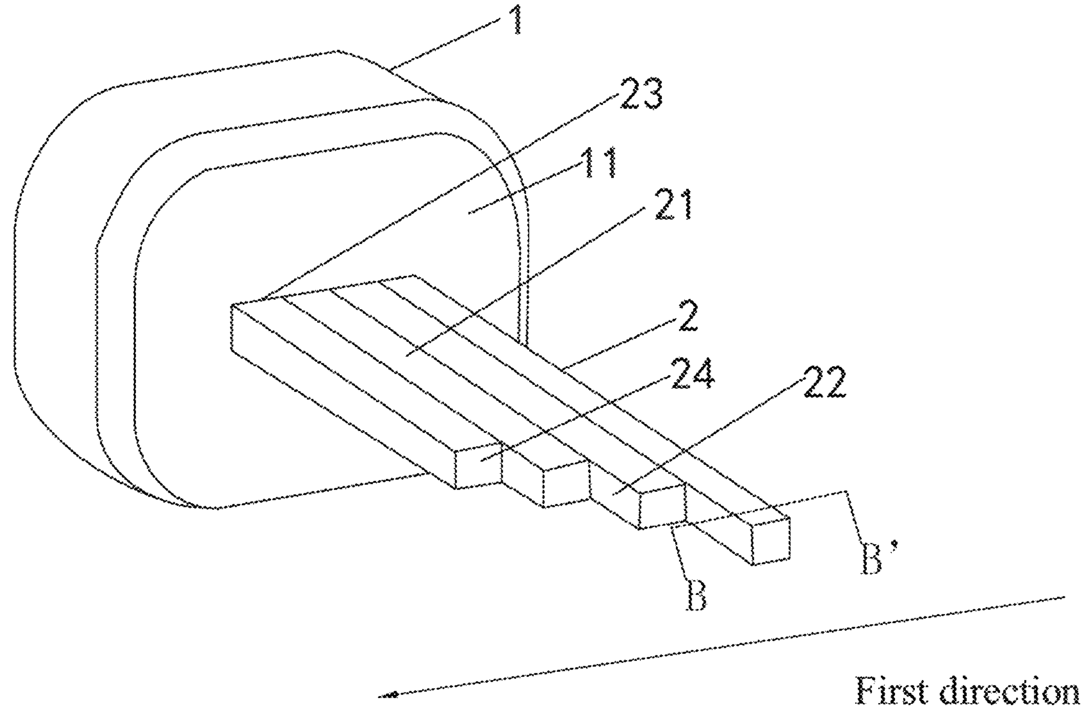
FIG. 4 is a schematic diagram of a structure of a resonator according to another embodiment of the present invention.

An embodiment of the present invention provides another resonator. FIG. 4 is a schematic diagram of a structure of a resonator according to another embodiment of the present invention. As shown in FIG. 4, the resonator includes: at least one air cavity 1 and a plurality of air passages communicating with the air cavity 1. The air cavity 1 and the air passages are tuned to generate one or more acoustic resonances.

In this embodiment of the present invention, as shown in FIG. 4, the resonator includes only one air cavity 1. The air cavity 1 has a hollow structure. The air cavity1 may include a plurality of side walls 11. In an example, the air cavity 1 includes a cubic structure, and the air cavity 1 may include six side walls 11, or less than six side walls 11 (such as five side walls 11). The air passage is provided at one or more side walls.

In this embodiment of the present invention, the air passages may be a tube 2. In this case, the resonator may include a plurality of tubes 2, and the plurality of tubes 2 communicates with the air cavity 1. As shown in FIG. 4, in an example, one tube 2 is provided at one side wall 11. In other example, a plurality of tubes may be provided at different walls 11, and such a case is not shown in the figures.

In this embodiment of the present invention, as shown in FIG. 4, the air passages may be a single tube 2 including partitions 21, and a dividing wall 22 is provided between any adjacent partitions 21.

In this embodiment of the present invention, as shown in FIG. 4, the tube 2 may be divided into a plurality of partitions 21 by the dividing walls 22, and the plurality of partitions 21 may be arranged in one row and multiple columns, or be arranged in multiple rows and multiple columns. There is only a thin dividing wall 22 between adjacent partitions 21.

Figure 5:
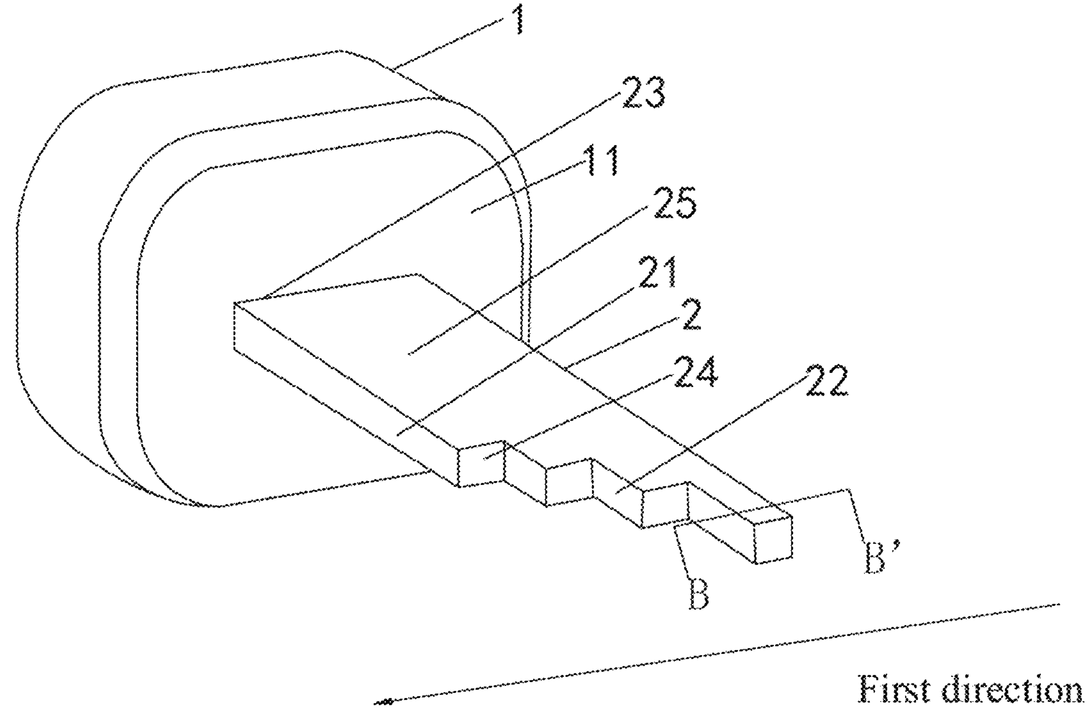
FIG. 5 is a schematic diagram of a structure of a resonator according to still another embodiment of the present invention.

FIG. 5 is a schematic diagram of a structure of a resonator according to still another embodiment of the present invention. In an example, as shown in FIG. 5, the dividing wall 22 may be used to support an outer wall 25 of the tube 2. For example, the outer wall 25 of the tube 2 may include a plastic film or the like.

In this embodiment of the present invention, a plurality of air passages is arranged in parallel to each other. In a case that the air passages are partitions 21, the partitions 21 are arranged in parallel to each other. As shown in FIG. 4, in a case that the air passages are a tube 2 including the partitions 21, the partitions 21 are arranged in one row and multiple columns.

In an example, the partitions may be not parallel to each other. For example, the partitions are arranged in a divergent shape, and such a case is not shown in the figures.

More than one partition 21 may be provided. In an example, as shown in FIG. 4, one tube 2 includes four partitions 21, and the four partitions 21 are arranged parallel to each other.

In this embodiment of the present invention, for example, the cross-sectional shapes of the partitions 21 may be the same.

Figure 6:
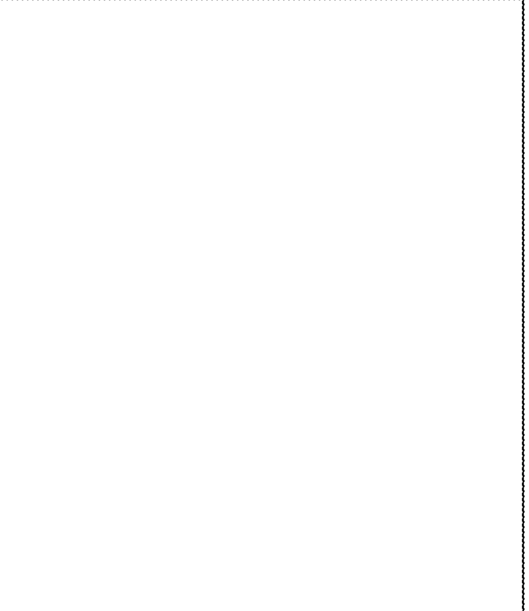
FIG. 6 is a cross-sectional view along B-B' of an air passage shown in FIG. 4 or FIG. 5.

In this embodiment of the present invention, the cross-sectional shape of the partition 21 can be configured according to requirements. FIG. 6 is a cross-sectional view along B-B' of an air passage shown in FIG. 4 or FIG. 5. As shown in FIG. 6, the cross-sectional shape of the partition 21 may be a rectangle. In other examples, the cross-sectional shape of the partition 21 may also be other shape, such as a circle, a hexagon, or an ellipse.

In an embodiment of the present invention, an end 23 of the air passage communicates with the air cavity 1, and another end 24 of the air passage is closed or open. As shown in FIG. 4, in a case that the air passage includes the partition 21, an end 23 of the partition 21 communicates with the air cavity 1, and another end 24 of the partition 21 is closed or open. Herein, the end 23 of the partition 21 refers to an end communicating with to the air cavity 1, and the other end 24 of the partition 21 refers to an end away from the air cavity 1.

In an example, an end of the air passage communicates with the air cavity, and another end of the air passage communicates with another external air volume. The external air volume may be an air passage, an air cavity, or an acoustic resonator. In a case that the external air volume is an air passage and the air passage is a partition, an end of the partition communicates with an air cavity, and another end of the partition communicates with another air cavity, that is, each of two ends of the partition communicates with a respective air cavity, i.e., the partition communicates with two air cavities, and such a case is not shown in the figures.

In this embodiment of the present invention, the plurality of air passages is arranged along a first direction, and along the first direction, an effective length of each of the plurality of air passages gradually decreases. As shown in FIG. 4, in a case that the air passages are the partitions 21, the partitions 21 are arranged along the first direction, and along the first direction, the effective length of each of the partitions 21 gradually decreases.

In this embodiment of the present invention, along the first direction, a ratio of the effective length of any air passage to the effective length of the next air passage is greater than 1 and smaller than or equal to 2. In an example, as shown in FIG. 4, in a case that the air passages are the partitions 21, along the first direction, the ratio of the effective length of any partition 21 to the effective length of the next partition 21 may be 2. In other examples, the ratio of the effective length of any partition 21 to the effective length of the next partition 21 may be greater than 1 and smaller than 2.

In this embodiment of the present invention, for all the air passages, the ratio of the effective length of an air passage to the effective length of the next air passage has a same value; or, for some of the air passages, the ratio of the effective length of an air passage to the effective length of the next air passage has a same value; or, for all the air passages, the ratio of the effective length of an air passage to the effective length of the next air passage has a different value. In a case that the air passages are the partitions, for all the partitions, the ratio of the effective length of a partition to the effective length of the next partition has a same value; or, for some of the partitions, the ratio of the effective length of a partition to the effective length of the next partition has a same value; or, for all the partitions, the ratio of the effective length of a partition to the effective length of the next partition has a different value. As shown in FIG. 4, for all the partitions 21, the ratio of the effective length of a partition 21 to the effective length of the next partition 21 has a same value.

In this embodiment of the present invention, the effective length of each partition 21 depends on the number of partitions 21, and the ratio of the effective length of a partition 21 to the effective length of the next partition 21 depends on the number of partitions 21.

In an embodiment of the present invention, for the respective effective lengths of the plurality of air passages, a ratio of the largest effective length to the smallest effective length is smaller than 2. As shown in FIG. 4, in a case that the air passages are partitions 21, for the respective effective lengths of the plurality of partitions 21, a ratio of the largest effective length to the smallest effective length is smaller than 2.

In this embodiment of the present invention, the effective length of the air passage is calculated by the formula (1): $L_n=k_nL_0$. As shown in FIG. 4, in a case that the air passages are partitions 21, $L_0$ denotes a length of a corresponding single partition 21 for achieving the desired acoustic mass, $k_n$ denotes a coefficient of $L_0$, $L_n$ denotes the effective length of the partition 21, and n denotes a sequential number of the partition 21 along the first direction.

In this embodiment of the present invention, an effective cross-sectional area of the air passage is calculated by the formula (2):

$$A_n = k_n\frac{A_0}{N}.$$

As shown in FIG. 4, in a case that the air passages are the partitions 21, $A_0$ denotes a cross-sectional area of a corresponding single partition 2 for achieving the desired acoustic mass, $k_n$ denotes a coefficient of $L_0$, N denotes the total number of partitions 21, $A_n$ denotes the effective cross-sectional area of the partition 21, and n denotes a sequential number of the partition 21 along the first direction.

In this embodiment of the present invention, the coefficient $k_n$ is calculated by the formula (3):

$$k_n = \frac{N}{r-1}\left(r^{\frac{n}{N}} - r^{\frac{n-1}{N}}\right).$$

As shown in FIG. 4, in a case that the air passages are partitions 21, N denotes the total number of partitions 21, and r is a constant.

In this embodiment of the present invention, the sequential number n of the air passage along the first direction ranges from 1 to N. As shown in FIG. 4, in a case that the air passages are the partitions 21, the total number of partitions 21 is four, and the respective sequential numbers of the partitions 21 along the first direction are sequentially 1, 2, 3, 4, that is, n is equal to 1, 2, 3, or 4.

In this embodiment of the present invention, a value of the constant r is larger than 1 and smaller than or equal to 2, and the constant r is usually equal to 2. In a case that the constant r is larger than 1 and smaller than 2, it can sometimes help to reduce the height of resonance peaks caused by some of highest modes, at the expense of less reduction of the lower modes.

The effective length and the effective cross-sectional area of the air passage can be determined by the formula (1) to the formula (3). In an example, as shown in FIG. 4, in a case that the air passages are the partitions 21, the effective length of the partition 21 and the effective cross-sectional area of the partition 21 that are calculated can be slightly enlarged to compensate for the slight increase in acoustic damping generated by using a plurality of partitions 21.

For ensuring a simpler mechanical implementation, the respective cross-sectional areas of the air passages may be the same, instead of being scaled as in formula (2). In an example, the effective length of the air passage is calculated by a formula (4):

$$L_n = \left(k_n \frac{1}{N} \sum_{m=1}^{N} \frac{1}{k_m}\right) L_0.$$

As shown in FIG. 4, in a case that the air passages are the partitions 21, $L_0$ denotes the length of a corresponding single partition 21 for achieving the required acoustic mass, $k_n$ denotes the coefficient of $L_0$, N denotes the total number of partitions 21, and $L_n$ denotes the effective length of the partition 21. The total number of partitions 21 shown in FIG. 4 is four, that is, N is equal to 4.

In this embodiment of the present invention, as shown in FIG. 4, in a case that the air passages are the partitions 21, the effective length of the partition 21 and the effective cross-sectional area of the partition 21 can be approximately determined by the formula (1) to the formula (4), and the effective length of the partition 21 and the effective cross-sectional area of the partition 21 can be slightly adjusted according to the cross-sectional shape of the partition 21 and other constraints.

In an embodiment of the present invention, as shown in FIG. 4, in a case that the air passages are the partitions 21, the total number N of partitions 21 can be freely selected, noting that a low number will not redistribute and attenuate higher modes as efficiently as a larger number, but also that a large number will result in smaller individual areas for each partition 21, which leads to progressively higher acoustic damping, thus attenuating also the desired main resonance of the acoustic resonator.

Figure 7:
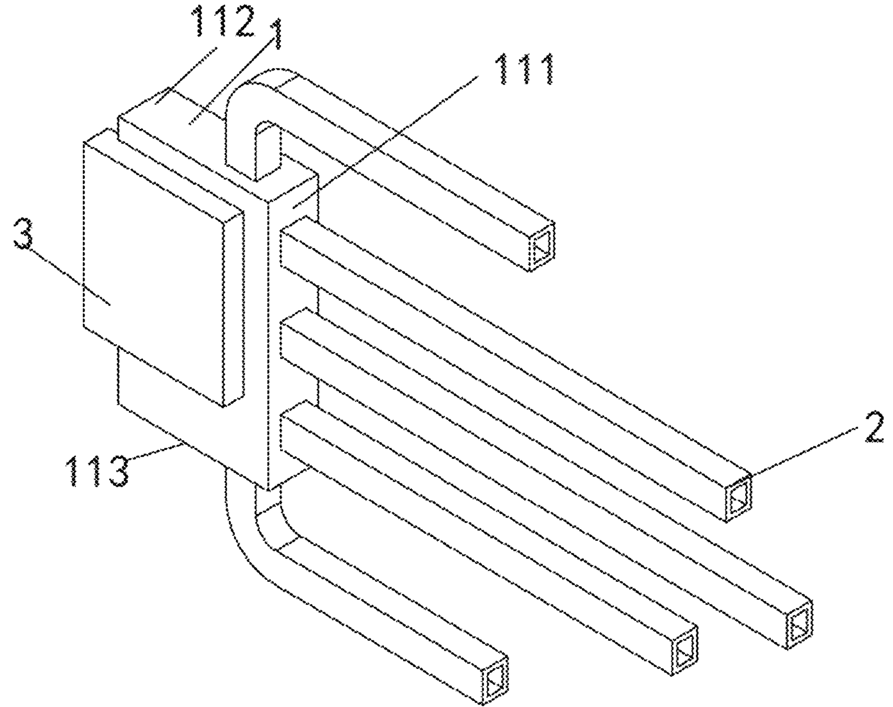
FIG. 7 is a schematic diagram of a structure of a resonator according to yet another embodiment of the present invention.

FIG. 7 is a schematic diagram of a structure of a resonator according to yet another embodiment of the present invention. In an example, as shown in FIG. 7, the resonator includes: at least one air cavity 1 and a plurality of air passages communicating with the air cavity 1. The cavity1 and the plurality of air passages are tuned to generate one or more acoustic resonances. The resonator further includes an acoustic port 3 provided at the at least one air cavity 1.

In this embodiment of the present invention, the air passage is a tube 2.

In an example, a plurality of tubes 2 are provided at different side walls 11. As shown in FIG. 7, the air cavity 1 includes a plurality of side walls 11, which for example includes a first surface 111, a second surface 112, and a third surface 113. The first surface 111 is adjacent to the second surface 112, the first surface 111 is adjacent to the third surface 113, and the second surface 112 is opposite to the third surface 113. A part of the plurality of air passages is provided at the first surface 111, another part of the plurality of air passages is provided at the second surface 112, and further another part of the air passage of the plurality of air passages are provided at the third surface 113. In an example, the tube 2 provided at the second surface 112 is bent toward an extension direction of the tube 2 provided at the first surface 111, and the tube 2 provided at the third surface 113 is bent toward the extension direction of the tube 2 provided at the first surface 111.

In an embodiment of the present invention, a portion of the air passage may extend into the air cavity, or the entire air passage may extend into the air cavity, and such a case is not shown the figures.

In an embodiment of the present invention, if an external space connected to an external end of the tube 2 is quite narrow and cannot provide sufficient air flow space, then it is advantageous to provide a plurality of tubes 2 as shown in FIG. 7.

Figure 8:
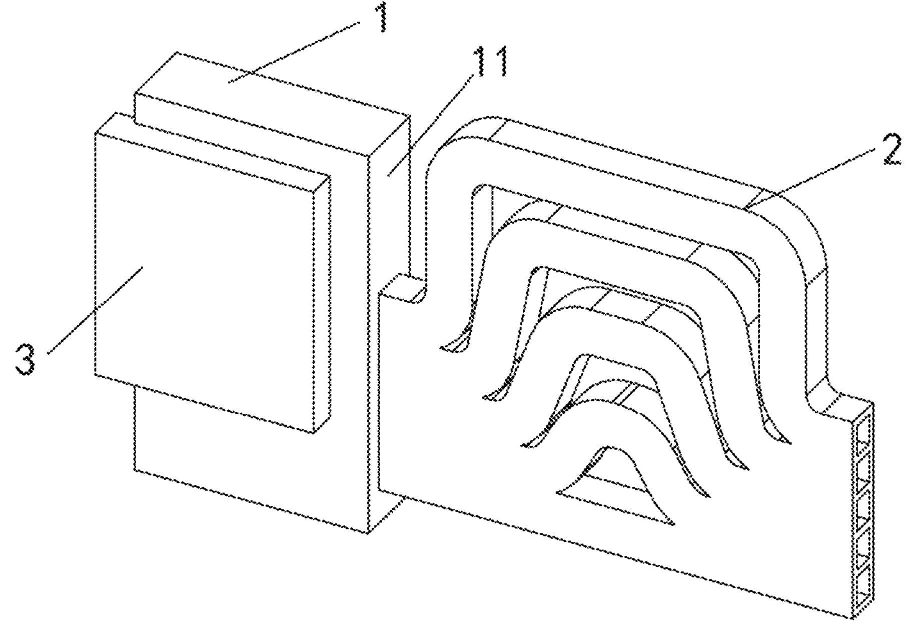
FIG. 8 is a schematic diagram of a structure of a resonator according to yet another embodiment of the present invention.

FIG. 8 is a schematic diagram of a structure of a resonator according to yet another embodiment of the present invention. In an example, as shown in FIG. 8, the resonator includes: at least one air cavity 1 and a plurality of air passages communicating with the air cavity 1. The air cavity 1 and the plurality of air passages are tuned to generate one or more acoustic resonances. The resonator further includes: an acoustic port 3 provided at the at least one air cavity 1.

In this embodiment of the present invention, the air passage is a tube 2.

In an embodiment of the present invention, an axis of the tube 2 may be bent into any shape. As shown in FIG. 8, the axes of the plurality of tubes 2 are all bent toward a same side, and the plurality of bent tubes 2 are provided at the side wall 11. The inlets of the plurality of tubes 2 converge to a side close to the side wall 11, so that the inlets of the plurality of tubes 2 are connected together; and the outlets of the plurality of tubes 2 converge to a side away from the side wall 11, so that the outlets of the plurality of tubes 2 are connected together. The middle portions of the plurality of tubes 2 are spaced apart from each other.

In an embodiment of the present invention, the shape of the tube may be a spiral shape, a straight tube shape, or a partially straight tube shape.

In an embodiment of the present invention, each of two ends of the tube includes a rounded corner structure or a horn-shaped structure, which is not shown in the figures.

Figure 9:
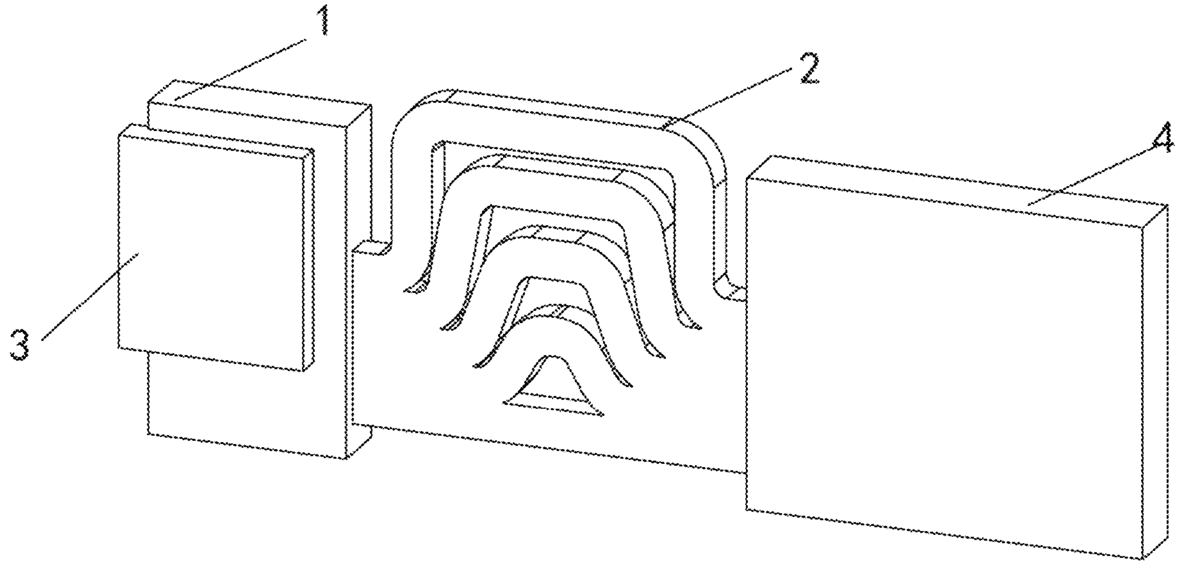
FIG. 9 is a schematic diagram of a structure of a resonator according to yet another embodiment of the present invention.

FIG. 9 is a schematic diagram of a structure of a resonator according to yet another embodiment of the present invention. In an example, as shown in FIG. 9, the resonator includes: at least one air cavity 1 and a plurality of air passages communicating with the air cavity 1. The air cavity 1 and the plurality of air passages are tuned to generate one or more acoustic resonances. The resonator further includes: an acoustic port 3 provided at the least one air cavity 1.

In this embodiment of the present invention, the axis of the tube 2 may be bent into any shape. As shown in FIG. 9, the axes of the plurality of tubes 2 are all bent toward a same side, and the plurality of bent tubes 2 are provided at the side wall 11. The inlets of the plurality of tubes 2 converge to a side close to the side wall 11, so that the inlets of the plurality of tubes 2 are connected together; and the outlets of the plurality of tubes 2 converge to a side away from the side wall 11, so that the outlets of the plurality of tubes 2 are connected together. The middle portions of the plurality of tubes 2 are spaced apart from each other. In a case that the air passage is a tube 2, an end of the tube 2 communicates with an air cavity 1, and another end of the tube 2 communicates with an external air volume 4.

In this embodiment of the present invention, the external air volume may be an air passage, an air cavity, or an acoustic resonator.

In this embodiment of the present invention, the external air volume may represent an internal air volume in the electronic device. The space of air between the electronic device covers and all internal components is usually very complicated. If a plurality of tubes can be connected to various parts of the space, the acoustic pressure generated by the resonator can be more effectively coupled to the constricted space, thereby increasing the acoustic mass.

In the technical solution provided by this embodiment of the present invention, the resonator includes: at least one air cavity and a plurality of air passages communicating with the air cavity. The air cavity and the plurality of air passages communicating with the air cavity are tuned, so that the desired acoustic mass and low acoustic damping can be reasonably well maintained, while distributing higher modes over a wider set of frequencies, while also making each of them proportionally weaker. Thus, they may be more easily made weak enough not to interfere with the desired behaviour of the overall acoustic resonator construction.

In the technical solution provided by this embodiment of the present invention, the air flow at one or two ends of the separated air passage will naturally be distributed along a larger distance, rather than all being distributed at a single end point. This can be advantageous when the air passage is connected to a constricted or geometrically complex air space, where it would otherwise be difficult to accommodate a large flow rate from a single air passage without causing flow noise or other artifacts.

In the technical solution provided by this embodiment of the present invention, there are no discontinuities along the length of any given air passage partition. This can avoid possible issues with flow noise that may arise if a single air passage is fitted with parallel resonators presenting edges etc. With the technical solution provided by the embodiments of the present invention, the radial modes can be moved to higher frequencies.

An embodiment of the present invention provides another resonator, and the resonator in this embodiment differs from the resonator in the foregoing embodiments in that, the air passage includes a groove. For specific description, please refer to the resonator described in the foregoing embodiments. In this embodiment, the groove may include a rigid material. For example, the groove may be covered by a component of another resonator or adhesive, and such a case is not shown in the figures.

In the present invention, the resonator in each of the embodiments corresponding to FIG. 2, FIG. 4, FIG. 7, FIG. 8 and FIG. 9 is driven by a speaker. However, the resonator provided in the embodiments of the present invention may also be driven by another resonator instead of a speaker.

In this embodiment of the present invention, the tube can be used as an acoustic port, or as a part of an acoustic port, and such a tube can be arranged in a band-pass speaker structure, so that the acoustic port can be tuned to a lower frequency than usual.

In an embodiment of the present invention, it can provide advantages in all constructions that need to use a long tube. If the tube is long enough compared to an acoustic wavelength to cause one or more unwanted extra resonances due to its higher acoustic modes. Such long tubes are usually coupled to air cavity and working as Helmholtz resonators. In this embodiment of the present invention, a set of tubes is used instead of a single tube to serve as an acoustic mass instead of a long tube that serves as a Helmholtz resonator, so as to provide advantages.

Figure 10:
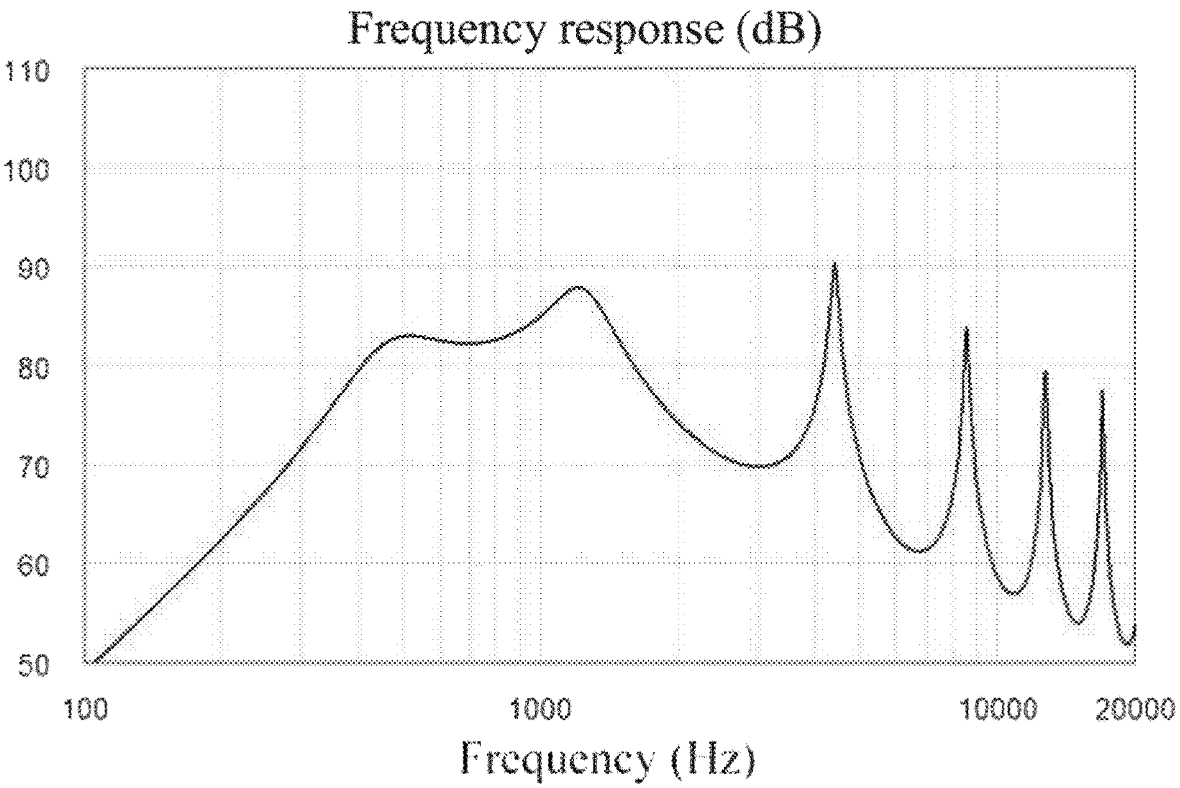
FIG. 10 is a schematic diagram illustrating application of a resonator in the related art.

FIG. 10 is a schematic diagram illustrating application of a resonator in the related art. FIG. 10 is a graph illustrating simulation in which the resonator in the related art is in a higher mode. As shown in FIG. 10, the right half of the graph includes four spikes. The acoustic pressure level at the peak is higher, indicating that the loss in the resonator is greater, which makes the attenuation at the peak greater. In the related art, these higher-frequency resonances will interfere with the acoustic structure, so the desired behaviour of the resonator cannot be guaranteed. Specifically, the resonance peak slightly above 1000 Hz is the main resonance peak caused by the resonator. This resonance peak is wanted, and it is therefore desired to attenuate it as little as possible. Other peaks at higher frequencies (in this figure e.g. slightly above 4000 Hz, and so on) represent unwanted higher modes, and it is desired to reduce the height of these peaks.

For example, an acoustic low-pass or band-pass filter effect may be desired, having only a single resonance at its cutoff frequency, but due to the additional longitudinal modes (the sharp spikes seen in FIG. 7), also certain narrow ranges of higher frequencies may be passed through, or other unwanted artifacts may occur.

Figure 11:
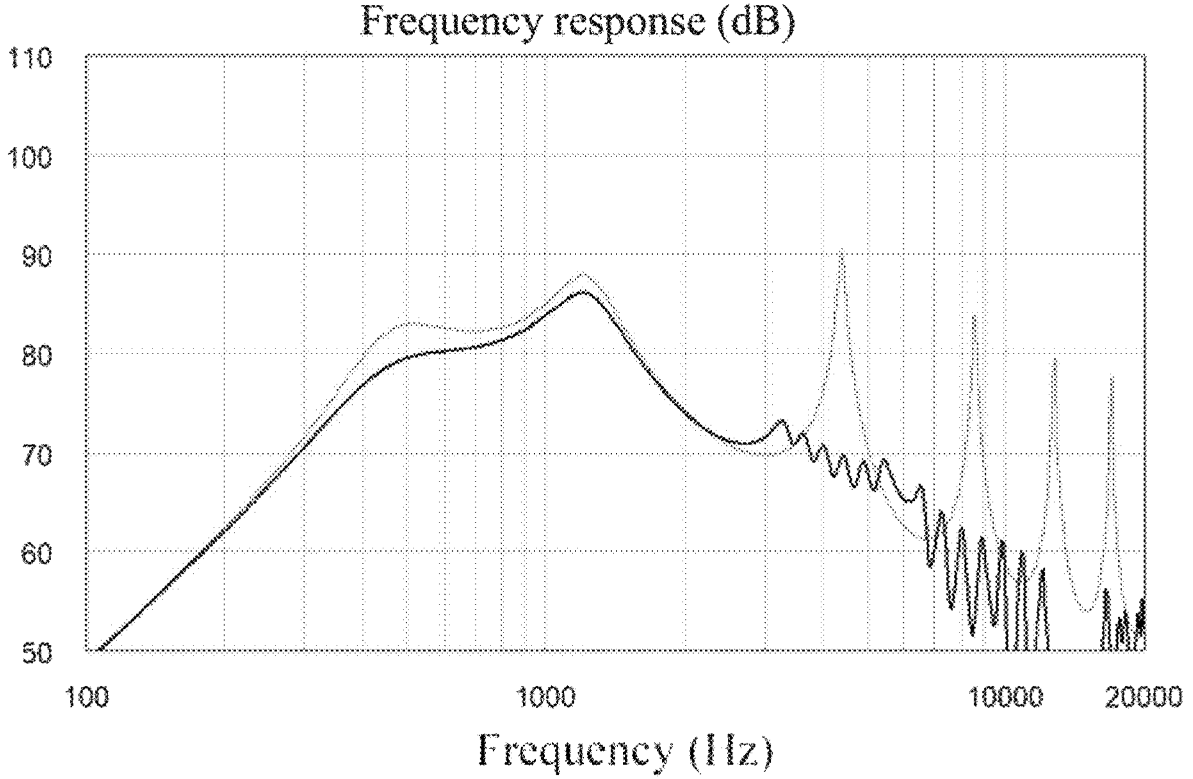
FIG. 11 is a schematic diagram illustrating application of a resonator according to an embodiment of the present invention.

FIG. 11 shows a simulation result of applying acoustic damping provided by an embodiment of the present invention to FIG. 10. As shown in FIG. 11, the total number of air passages of the resonator shown is six, that is, six parallel tubes, partitions or grooves, and the constant r is equal to 1.8. FIG. 11 shows the same example case when applying the present invention. It should be noted that the resonance peaks above 4000 have been reduced in height as desired, but with much less impact on the main resonance peak slightly above 1000 Hz compared to FIG. 12.

As shown in FIG. 11, there is significant attenuation of the higher modes, with only a minor effect on the main resonance slightly above 1000 Hz. Compared with FIG. 10, the acoustic pressure levels at the peaks slightly higher than 1000 Hz in the right half of the graph in FIG. 11 are smaller, indicating that the loss in the resonator is smaller, which makes the attenuation at the peaks smaller, thereby guaranteeing the desired behaviour of the resonator. Compared with the radial modes shown in FIG. 10 or FIG. 12, the radial modes in FIG. 11 are moved to higher frequencies, so as to guarantee the desired behaviour of the resonator.

Figure 12:
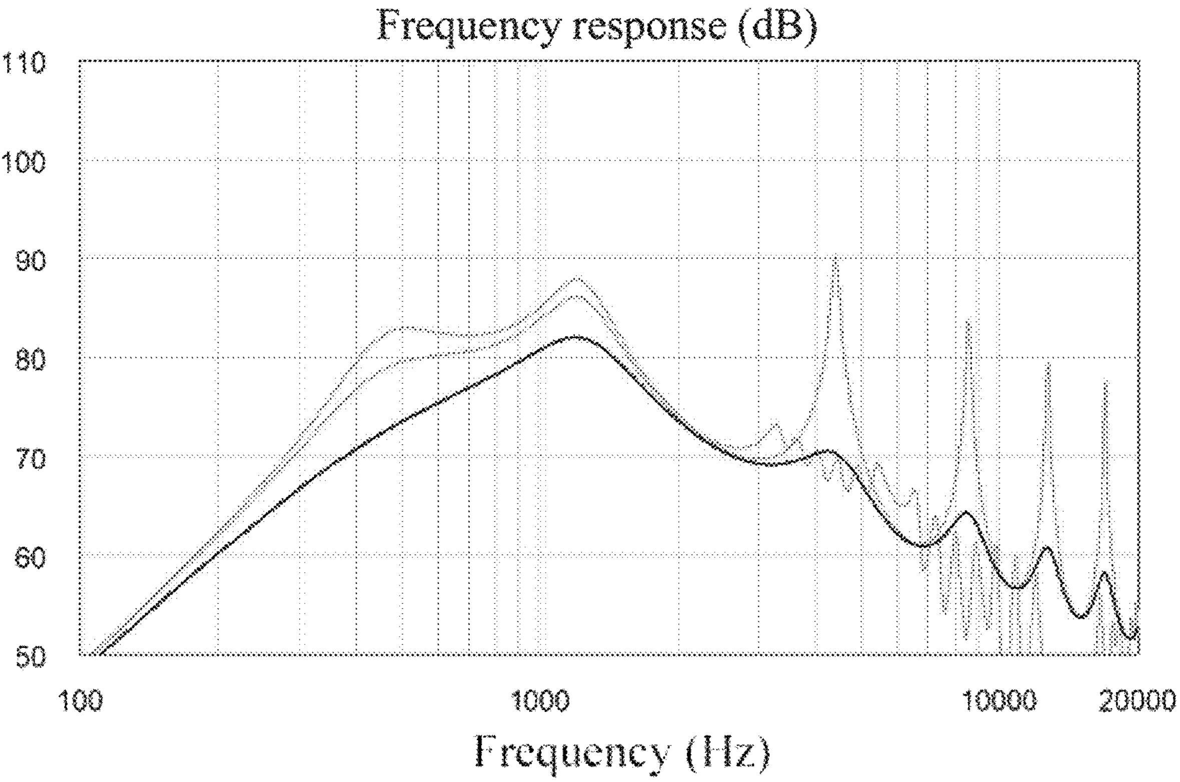
FIG. 12 is a schematic diagram illustrating application of another resonator in the related art.

FIG. 12 shows a simulation result of applying acoustic damping to FIG. 10. The acoustic damping is provided to an end of the air passage. In FIG. 12, the damping of the main resonance is significantly higher, which attenuates the main resonance, so the desired behaviour of the resonator cannot be guaranteed. FIG. 12 shows the same example case where attenuating material has been added according to prior art. Resonance peaks above 4000 Hz have been reduced in height. But the desired main resonance (slightly above 1000 Hz) is also quite severely attenuated.

An embodiment of the present invention provides an electronic device, which includes electrical equipment composed by microelectronic devices, such as a speaker, an earphone, a computer, or a watch.

An electronic device provided by an embodiment of the present invention includes the resonator in the embodiment corresponding to FIG. 2, FIG. 4, FIG. 7, FIG. 8 or FIG. 9. For specific description, please refer to the resonator described in the foregoing embodiments.

In the technical solution provided by the embodiments of the present invention, the resonator includes at least one air cavity and a plurality of air passages communicating with the air cavity, and the air cavity and the air passages communicating with the air cavity are tuned, so that the desired acoustic mass and low acoustic damping can be reasonably well maintained, while distributing higher modes over a wider set of frequencies, while also making each of them proportionally weaker. Thus, they may be more easily made weak enough not to interfere with the desired behaviour of the overall acoustic resonator construction.

The above-described embodiments are merely preferred embodiments of the present invention and are not intended to limit the present invention. Any modifications, equivalent substitutions and improvements made within the principle of the present invention shall fall into the protection scope of the present invention.

What is claimed is:

1. A resonator, comprising: at least one air cavity and a plurality of air passages communicating with the at least one air cavity; wherein the at least one air cavity and the plurality of air passages are tuned to generate one or more acoustic resonances;

the plurality of air passages is arranged along a first direction; each of the plurality of air passages has an effective length;

for all the effective lengths of the plurality of air passages, a ratio of the largest effective length to the smallest effective length is smaller than 2;

the effective length of each of the plurality of air passages is calculated by a formula: $L_n=k_aL_o$, where $L_o$ denotes a length of a corresponding single air passage for achieving a desired acoustic mass, $k_n$ denotes a coefficient of $L_o$, $L_n$ denotes the effective length of each of the plurality of air passages, and n denotes a sequential number of the plurality of air passages.

2. The resonator as described in claim 1, further comprising: an acoustic port provided at the at least one air cavity.

3. The resonator as described in claim 1, wherein each of the plurality of air passages is a tube.

4. The resonator as described in claim 3, wherein a cross-sectional shape of each tube is a circle, a rectangle or an irregular shape.

5. The resonator as described in claim 3, wherein the axis of each tube is bent toward a same side.

6. The resonator as described in claim 3, wherein each of two ends of each tube comprises a rounded corner structure or a horn-shaped structure.

7. The resonator as described in claim 1, wherein the plurality of air passages is a plurality of partitions of a single tube; and a respective dividing wall is provided between any two adjacent partitions of the plurality of partitions.

8. The resonator as described in claim 1, wherein each of the plurality of air passages comprises a groove.

9. The resonator as described in claim 1, wherein the plurality of air passages is parallel to each other.

10. The resonator as described in claim 1, wherein an effective cross-sectional area of each of the plurality of air passages is calculated by a formula:

$$A_n = k_n \frac{A_o}{N},$$

where $A_o$ denotes a cross-sectional area of a corresponding single air passage for achieving a desired acoustic mass, $k_n$ denotes the coefficient of $L_o$, N denotes a total number of the plurality of air passages, $A_n$ denotes the effective cross-sectional area of each of the plurality of air passages, and n denotes a sequential number of the the plurality of air passages.

11. The resonator as described in claim 1, wherein the coefficient, where N denotes a total number of the plurality of air passages, and r is a constant.

12. The resonator as described in claim 1, wherein the at least one air cavity comprises a first surface, a second surface, and a third surface; the first surface is adjacent to the second surface, the first surface is adjacent to the third surface, and the second surface is opposite to the third surface; and a part of the plurality of air passages is provided at the first surface, another part of the plurality of air passages is provided at the second surface, and further another part of the plurality of air passages is provided at the third surface.

13. The resonator as described in claim 12, wherein an air passage provided at the second surface is bent toward an extension direction of an air passage provided at the first surface, and an air passage provided at the third surface is bent toward the extension direction of the air passage provided at the first surface.

14. The resonator as described in claim 1, wherein the plurality of air passages partially extends into the at least one air cavity, or the plurality of air passages entirely extends into the at least one air cavity.

15. The resonator as described in claim 1, wherein each of the plurality of air passages comprises an end communicating with the at least one air cavity, and another end communicating with an external air volume which is chosen from air passage, air cavity and acoustic resonator.

16. The resonator as described in claim 10, the coefficient of $L_o$ is calculated by a formula:

$$k_n = \frac{N}{r-1}\left(r^{\frac{n}{N}} - r^{\frac{n-1}{N}}\right),$$

where N denotes the total number of the plurality of air passages, and r is a constant.

* * * * *